United States Patent
Jojiki

(10) Patent No.: US 6,462,398 B1
(45) Date of Patent: *Oct. 8, 2002

(54) SEMICONDUCTOR DEVICE AND SEMICONDUCTOR ASSEMBLY APPARATUS FOR SEMICONDUCTOR DEVICE

(75) Inventor: Masao Jojiki, Saitama (JP)

(73) Assignee: Asahi Kogaku Kogyo Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/350,391

(22) Filed: Jul. 9, 1999

(30) Foreign Application Priority Data

Jul. 9, 1998 (JP) .......................................... 10-194570

(51) Int. Cl.7 .............................................. H01L 29/06
(52) U.S. Cl. ...................... 257/618; 257/700; 257/714; 257/723
(58) Field of Search ................................ 257/618, 700, 257/714, 723, 443

(56) References Cited

U.S. PATENT DOCUMENTS

| | | | |
|---|---|---|---|
| 2,714,183 | * 7/1955 | Hall | 257/618 |
| 2,890,976 | * 6/1959 | Lehovec | 257/618 |
| 3,976,508 | * 8/1976 | Mlavsky | 136/89 |
| 4,829,173 | * 5/1989 | Ditchek et al. | 250/211 |
| 4,984,037 | * 1/1991 | Ditchek et al. | 357/22 |
| 5,070,701 | * 12/1991 | Saeki et al. | 62/3.1 |
| 5,098,862 | * 3/1992 | Ditchek et al. | 437/203 |
| 5,269,882 | * 12/1993 | Jacobsen | 257/618 |
| 5,285,090 | * 2/1994 | Ditchek et al. | 257/281 |
| 5,357,269 | * 10/1994 | Zeltser | 346/76 |
| 6,157,285 | * 12/2000 | Tokuda et al. | 336/200 |

FOREIGN PATENT DOCUMENTS

WO     WO 98/25090     6/1998

* cited by examiner

Primary Examiner—Jerome Jackson, Jr.
(74) Attorney, Agent, or Firm—Pitney, Hardin, Kipp & Szuch LLP

(57) ABSTRACT

In a semiconductor device, a plurality of linear semiconductors of a predetermined length, on which electronic element are formed, are aligned laterally and in parallel. A semiconductor assembly apparatus for assembling the semiconductor device, aligns the linear semiconductors in parallel via an arranging member. The linear semiconductors are interconnected by a connecting member in the semiconductor assembly apparatus.

14 Claims, 10 Drawing Sheets

US 6,462,398 B1

SEMICONDUCTOR DEVICE AND SEMICONDUCTOR ASSEMBLY APPARATUS FOR SEMICONDUCTOR DEVICE

BACKGROUND OF THE INVENTION

1. Field of the Invention

The present invention relates to a semiconductor device and a semiconductor assembly apparatus for assembling the semiconductor device.

2. Description of the Related Art

In conventional semiconductor devices, circuits are formed on a flat silicon wafer. In order to decrease manufacturing expense, a large diameter single silicon crystal column is manufactured through a crystal growth method, which is then divided into a multitude of wafers. The manufacturing apparatus becomes more expensive as the diameter of the single crystal column increases. During manufacture of the conventional semiconductor device, the wafer is conveyed by a belt conveyor, for example, through many manufacturing stages, while being subjected to successive manufacturing processes. The manufacturing process is intermittent, taking several months to completion. In response to an increasing speed in circuit density of 4 times per three years, the fine-process becomes finer and finer. The result is an increasing and immense experimental cost for particle treatment, stepper, CMP and so forth.

SUMMARY OF THE INVENTION

It is therefore an object of the present invention to provide a linear semiconductor device and continuous-process semiconductor manufacturing apparatus that has a low manufacturing cost and is produced in a short manufacturing time.

It is therefore a further object of the present invention to provide a three-dimensional semi-conductor of high integration without the requirement of forming fine circuitry.

To attain the objects described a semiconductor device according to the present invention includes a plurality of linear semiconductors of a predetermined length parallelly aligned in a lateral direction, each of which includes linear semiconductor material and at least one circuit element formed on a surface of the linear semiconductor material.

A semiconductor device according to the present invention could further include a plurality of linear semiconductors aligned laterally in a square matrix or in a 60 degrees rhombic matrix.

A semiconductor device according to the present invention could further include a plurality of linear semiconductors electrically connected with each other where projection electrodes are formed on outer surfaces of linear semiconductors for connecting a plurality of linear semiconductors with one another and/or fixing the linear semi-conductors relative to one another.

A semiconductor assembly apparatus according to the present invention assembles a semiconductor device utilizing a plurality of linear semiconductors of a predetermined length. The semiconductor assembly apparatus includes an arranging member for parallelly aligning the linear semiconductors extending in a longitudinal direction, and a connecting member for connecting the linear semiconductors electrically with each other.

The semiconductor assembly apparatus according to the present invention can further align a plurality of linear semiconductors laterally in a square matrix or in a 60 degree rhombic matrix.

In the semiconductor assembly apparatus according to the present invention, preferably the arranging member includes a positioning member for fixing a position of each of the linear semiconductors relative to the other linear semiconductors. Preferably, the connecting members electrically connect the linear semiconductors with each other when heated, and the arranging member is liquefied when heated. Preferably, the arranging member includes a plurality of longitudinal members of a rhomboid cross-section parallelly aligned in a lateral direction, each of which decreases in thickness outwardly in the lateral direction and are connected with a neighboring longitudinal member at a narrow connecting portion thereof. The side surface of the longitudinal members touch the outer surface of the linear semiconductors.

The narrow connecting portion in the semiconductor assembly apparatus may be provided with holes which receive the projection electrodes formed on the outer surface of the linear semiconductor.

BRIEF DESCRIPTION OF THE DRAWINGS

The present invention will be better understood from the description of the preferred embodiments of the invention set forth below together with the accompanying drawings, in which.

DESCRIPTION OF THE PREFERRED EMBODIMENTS

Hereinafter, the preferred embodiments of the present invention are described with reference to the attached drawings.

Figure 1:
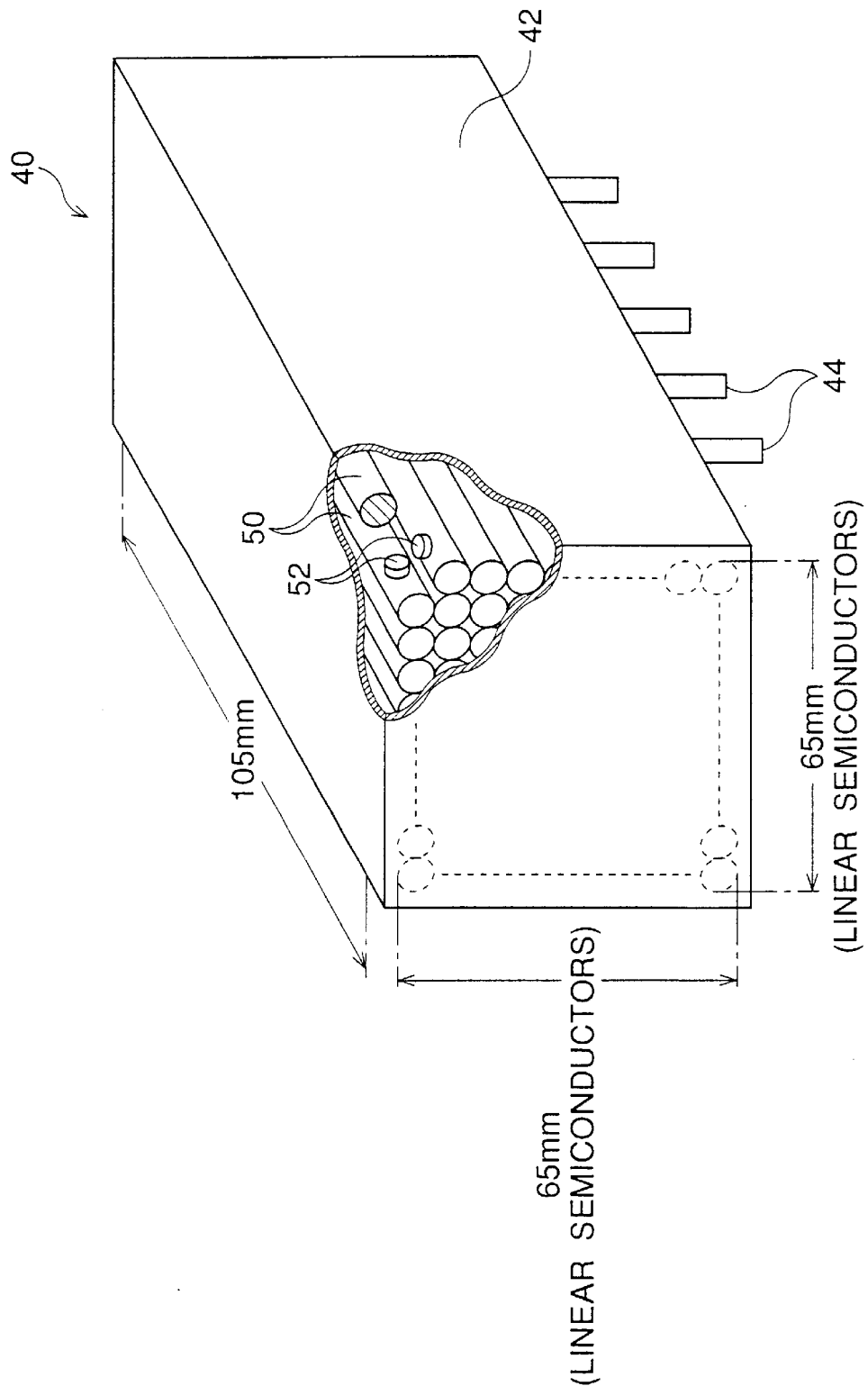
FIG. 1 is a partially-sectioned perspective view showing a semiconductor device manufactured by an embodiment of a semiconductor assembly apparatus according to the present invention.

FIG. 1 is a perspective view showing a semiconductor device, being a memory device, manufactured by an embodiment of a semiconductor assembly apparatus according to the present invention. The semiconductor device 40 includes a plurality of linear semiconductors 50 which are bundled within a rectangular parallelepiped casing 42. A circuit pattern is formed on a surface of the linear semiconductors 50 by an embodiment of a circuit forming apparatus according to the present invention. A multi-layer construction of a plurality of thin semiconductor layers (not shown) including P-type or n-type circuitry elements is formed on each linear semiconductor 50. The circuitry elements are insulated by insulator layers and connected through conductor layers. Further, capacitors (not shown) are formed for accumulating charge. A plurality of input/output terminals 44 are disposed on an outer surface of the casing 42, and are connected to the linear semiconductors 50.

Each of the linear semiconductors 50 has a circular cross-section with a diameter of 260 µm and a length of 105 mm. A rectangular bundle of the linear semiconductors 50 is formed, in which 250 linear semiconductors 50 are aligned horizontally as well as vertically forming a matrix cross-section arrangement. On each linear semiconductor 50, 1024 memory devices are aligned in a circumferential direction and 131072 memory devices are aligned in an axial direction on the surface of each linear semiconductor 50, according to a 0.1 µm rule. One linear semiconductor 50 has a memory capacity of 16 Mbyte, and the semiconductor device 40 comprises a total memory capacity of 1 Tbyte. Electrodes 52 are formed on each of the linear semiconductors 50 for connecting the linear semiconductors 50 with each other.

Figure 2:
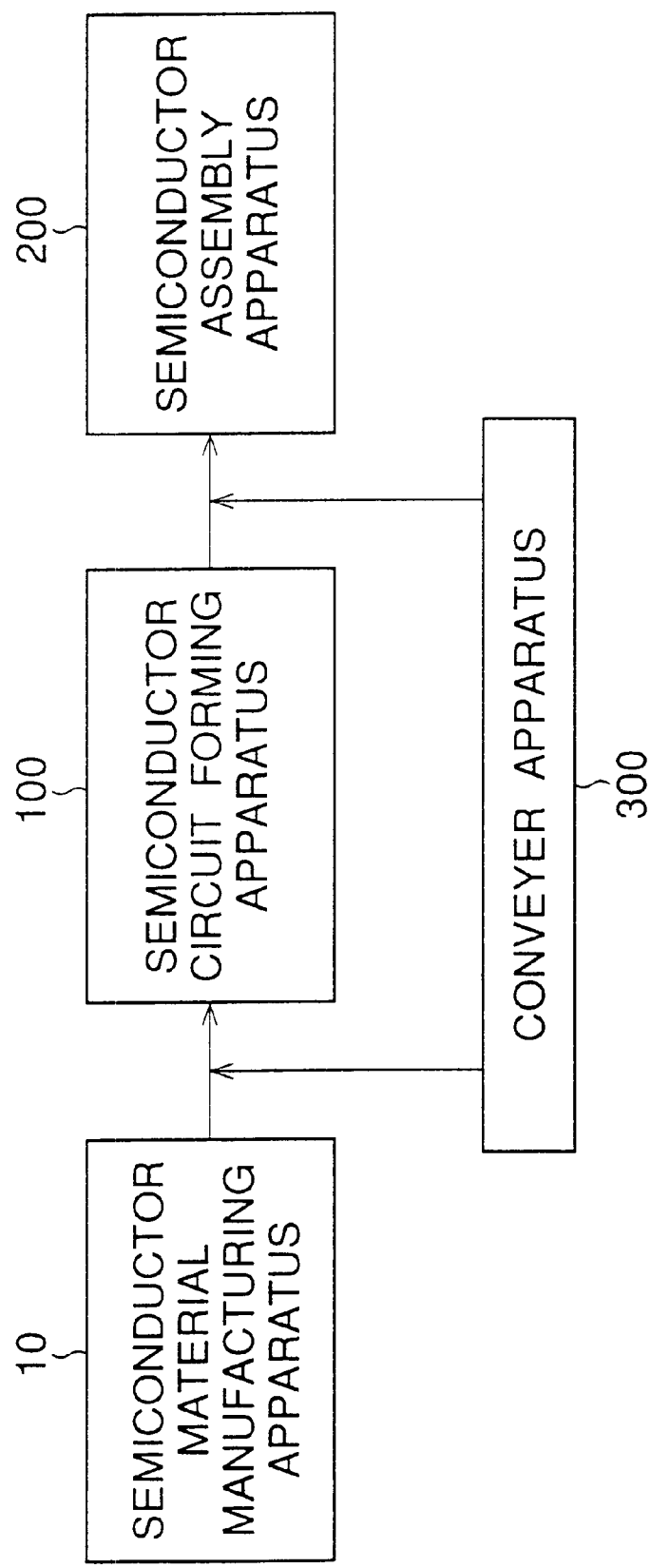
FIG. 2 is a block diagram showing a manufacturing process for manufacturing the semiconductor device in FIG. 1.

FIG. 2 is a block diagram showing a manufacturing process of a semiconductor assembly apparatus, for manufacturing the semiconductor device 40. First, a linear semiconductor base filament (reference 31 in FIG. 3) is manufactured by a semiconductor material manufacturing apparatus 10, and is conveyed to a circuit forming apparatus by conveyor apparatus 300. A circuit pattern is formed on a surface of the linear semiconductor base filament (31) in the semiconductor circuit forming apparatus 100, creating a linear semiconductor material (reference 30 in FIG. 4), from which the linear semiconductor 50 is obtained. The linear semiconductors 50 are conveyed to a semiconductor assembly apparatus 200 by the conveyor apparatus 300, which manufactures the semiconductor device 40 in FIG. 1.

Figure 3:
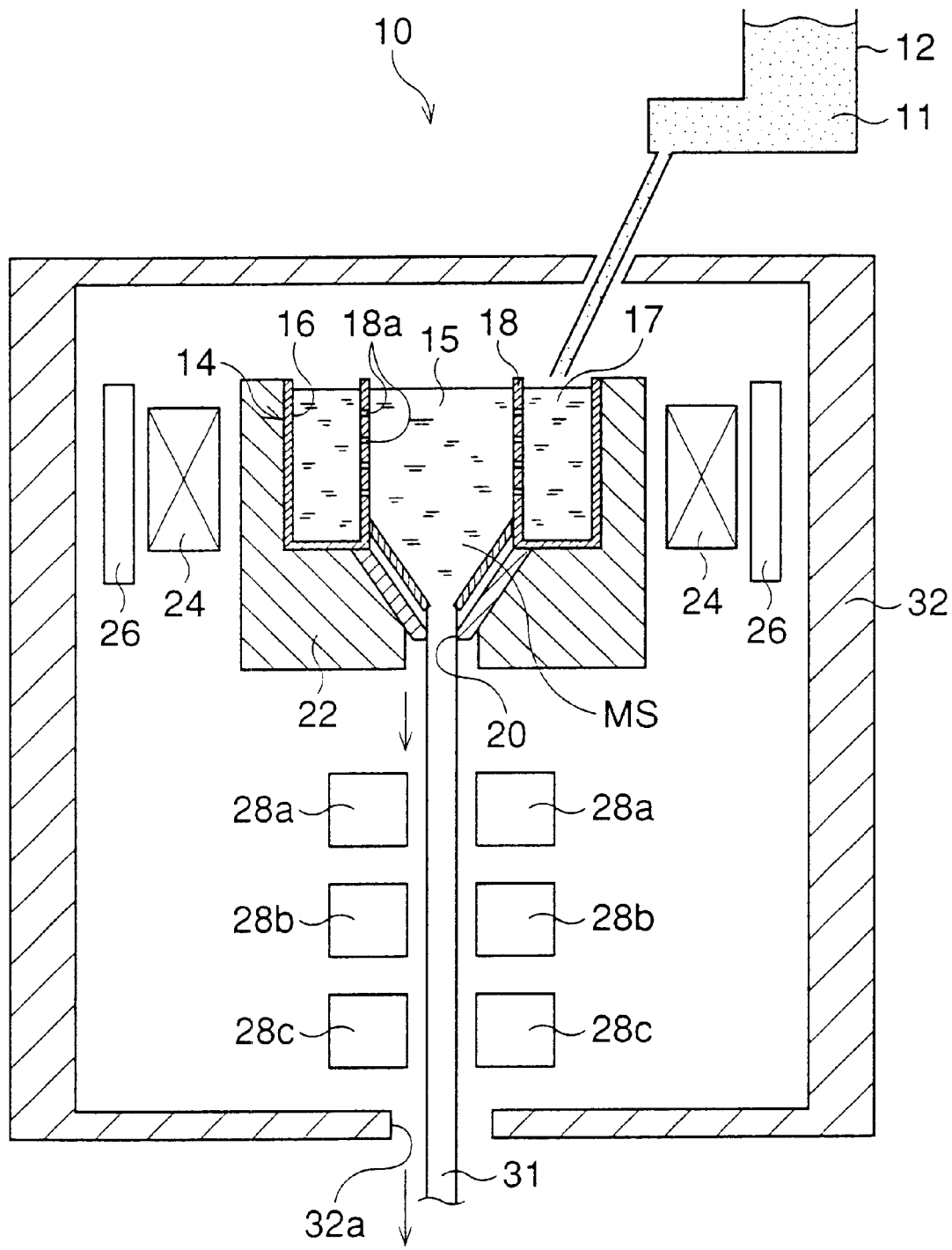
FIG. 3 is a cross-sectioned elevational view of the semiconductor material manufacturing apparatus identified in FIG. 2.

FIG. 3 is a cross-sectioned elevational view of the semiconductor material manufacturing apparatus identified in FIG. 2. The semiconductor material manufacturing apparatus 10 includes a double crucible 14 for melting a polycrystalline silicon 11. A supplier 12 is disposed higher than the double crucible 14 for supply, via gravity-feed, the polycrystalline silicon 11 to the double crucible 14. The double crucible 14 includes a cylindrical central furnace 15, and an annular furnace 17 concentric with and surrounding the central furnace 15. The central furnace 15 and the annular furnace 17 are partitioned by a partition wall 18 and discharge via a common outlet 20 that opens downwardly. The annular furnace 17 has an outer wall 16. The double crucible 14 is made of a high purity graphite or quartz. The common outlet 20 has a conical wall funneling to a circular bottom exit hole of 1 mm diameter, such that the molten silicon MS is extruded into a thin linear semiconductor base filament 31. The diameter of the circular hole is adjusted in response to a required diameter of the linear semiconductor base filament 31.

The polycrystalline silicon 11 is fed into the annular furnace 17, and heated until molten at about 1500° C., by an annular electromagnetic coil 24 concentric with and surrounding the double crucible 14, through high frequency heating. The annular electromagnetic coil 24 may be a resistance-type heater, such as a graphite heater. Through-holes 18a are disposed in the partition wall 18 through which the molten silicon MS passes between the central furnace 15 and the annular furnace 17. An annular electromagnet 26, concentric with the double crucible 14 and the electromagnetic coil 24, is disposed surrounding the electromagnetic coil 24, and controls convection of the molten silicon MS. The double crucible 14 is supported by a support body 22 made of heat-resisting graphite. The molten silicon MS flows downward from the outlet 20 and is gradually cooled. A plurality of heaters 28a, 28b and 28c are aligned along a flowing path of the molten silicon MS, heating temperatures of which are set in a decreasing order. Thus, the molten silicon MS is gradually solidified, such that a linear semiconductor base filament 31 of single silicon crystal is formed.

A temperature gradation of the heaters 28a, 28b and 28c is adjusted in response to the set diameter of the outlet 20. The electromagnet 26 and the heaters 28a, 28b and 28c are controlled by a control apparatus (not shown). The double crucible 14 and heaters 28a to 28c are encapsulated by a heat insulated housing 32. The cooled linear semiconductor base filament 31 exits through a bottom opening 32a and is coiled on a drum (not shown in FIG. 3, reference 102 in FIG. 4). The linear semiconductor base filament 31, in this embodiment, has a diameter of 260 µm.

Due to surface tension, a cross-section of the molten silicon MS becomes circular. The diameter of the linear semiconductor base filament 31 of the silicon single crystal is controlled by the diameter of the outlet 20 and the cooling by the heaters 28a, 28b and 28c. The molten silicon MS is cooled from the outer surface, and crystal defects are compressed by the solidifying pressure, separating out to the outer surface. The crystal defects are removed by a removing apparatus (not shown), such as an acid processing apparatus.

A pressure and heat application unit (not shown) may be further disposed for improving the single crystal of the linear semiconductor base filament 31, which is manufactured by the double crucible 14. The linear semiconductor base filament 31 that extends vertically and downwardly from the outlet opening 32a is axially pulled by two pairs of rollers (not shown). The linear semiconductor base filament 31, undergoes heat treatment at a temperature enabling recrystallization, such that silicon not crystallized by the heaters 28a, 28b and 28c is crystallized to a single crystal.

The linear semiconductor base filament 31 is coiled on the supply drum 102 (FIG. 4) and supplied by the conveyer apparatus 300 to the semiconductor circuit forming apparatus 100 (FIG. 2).

Figure 4:
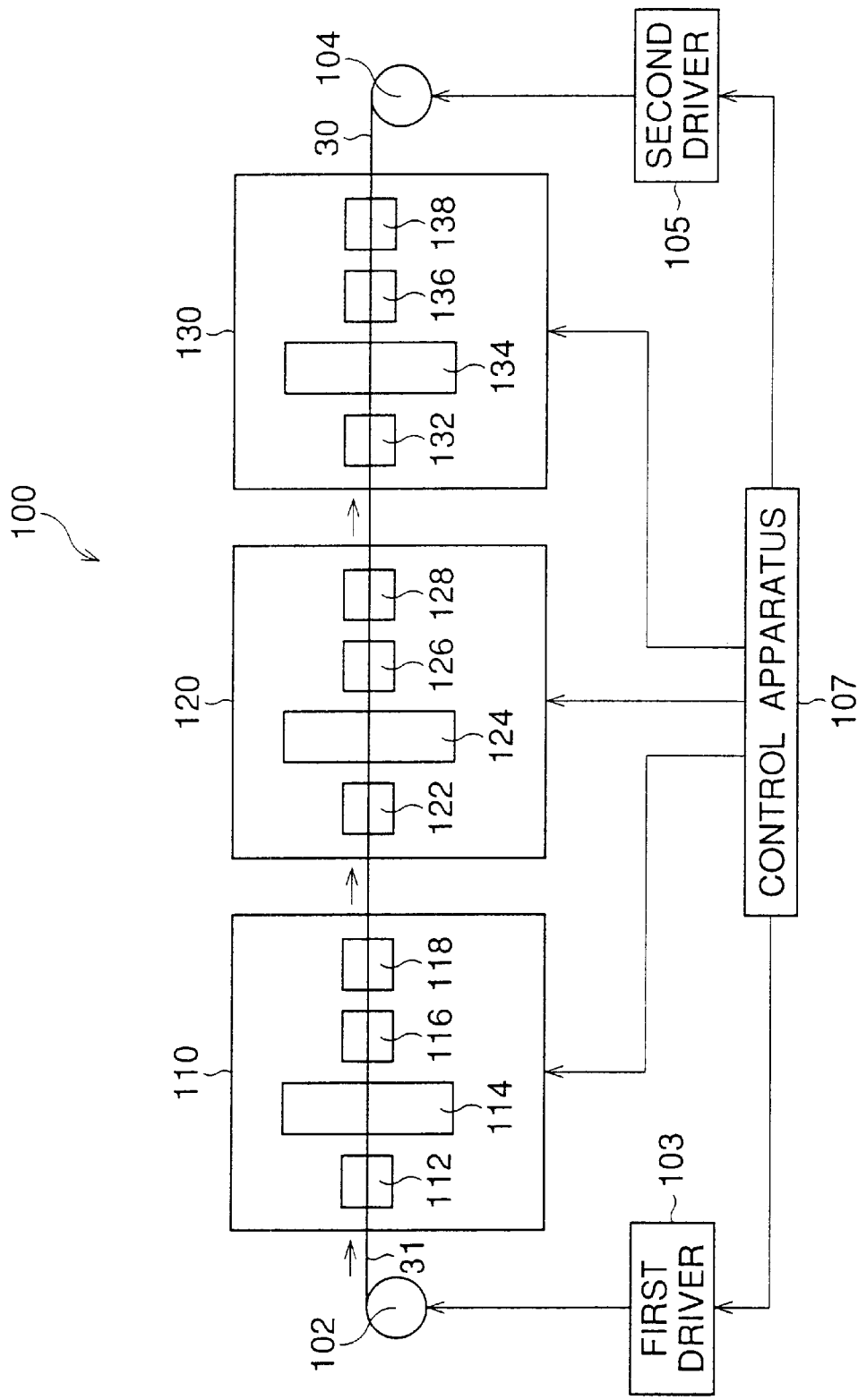
FIG. 4 is a block diagram showing the semiconductor circuit forming apparatus identified in FIG. 2.

FIG. 4 is a block diagram showing the embodiment of the semiconductor circuit forming apparatus 100. The semiconductor circuit forming apparatus 100 includes a supply drum 102 and a coiling drum 104 driven by first and second drivers 103 and 105, respectively. An oxide layer has been already coated on the outer surface of the linear semiconductor base filament 31, and the oxide layer is coated over with a nitride layer. The linear semiconductor base filament 31 is wound off the supply drum 102 and supplied to the semiconductor circuit forming apparatus 100. The circuit pattern is formed on the linear semiconductor base filament 31, generating a linear semiconductor material 30, and the linear semiconductor material 30 is taken up by the coiling drum 104. The drivers 103 and 105 are controlled by a control apparatus 107.

In the semiconductor circuit forming apparatus 100, "k" (k: integer number) number of circuit patterns are formed by repeating the circuit pattern forming process "k" times, using a resist layer and a scan beam for drawing a circuit pattern on the resist layer. "k" circuit pattern forming apparatuses 110 to 130 (only three are shown for ease of understanding) are aligned along a conveyer path of the linear semiconductor base filament 31.

In the first circuit pattern forming apparatus 110, a gate oxide layer is formed, in the second circuit pattern forming apparatus 120 and in the following circuit pattern forming apparatus, sources, drains, insulating layers and conductor layers are formed in the P-type or ntype semiconductor layers. The first circuit pattern forming apparatus 110 includes a resistance layer forming portion 112, a drawing portion 114, a etching portion 116 and a post-process portion 118, in this order from the supply drum 102.

The second and the third circuit pattern forming apparatuses 120 and 130 are similar to the first circuit pattern forming apparatus 110, and corresponding components are designated by increasing like references by "10" and by "20", respectively.

The linear semiconductor base filament 31 is coated by the oxide layer, and the oxide layer is coated by the nitride layer, prior to the first pattern forming process by the first pattern forming apparatus 110.

In the resist layer forming portion 112, a liquid photo-resist is applied to the linear semiconductor base filament 31, and is thermally dried. Thus, the resist layer is formed as a protective layer against the etching. Since well-known conventional methods are used for the resist layer forming and thermal drying, descriptions are omitted.

In the graphic portion 114, the liner semiconductor base filament 31 coated with the photo-resist (called "linear semiconductor material 30", hereinafter) is exposed to an electron beam and then developed. The resist layer selectively remains without being etched.

In the etching portion 116, an acid etching liquid is blown against the linear semiconductor material 30 to remove an exposed nitride layer, allowing the first thin nitride layer corresponding to the first circuit pattern to be formed. Next, a channel-stopper is formed by ion-shooting and so forth, then the resist layer is removed. Since a conventionally well-known method is applied for the etching and resist layer removal, descriptions are omitted.

In the post-processing portion 118, a field oxidation process, a nitride layer etching process, an oxide layer etching process, a gate-oxidation process and a polysilicon build-up process are performed. Since these processes are well-known, descriptions are omitted.

The linear semiconductor material 30 on which the first thin layer of the first circuit pattern is formed, is transferred to the second circuit pattern forming apparatus 120, such that the second circuit pattern is additionally formed. The circuit pattern forming is repeated "k" times and the total layers of the circuit patterns are successively formed. When the total layers are formed and the linear semiconductor material 30 is coiled on the coiling drum 104, the linear semiconductor material 30 is sectioned into predetermined lengths forming linear semiconductors 50.

Different processes are performed in the post-processing portions 118, 128 and 138 in the semiconductor circuit pattern forming apparatuses 110, 120 and 130, respectively. For example, a source-drain forming process and a phosphorous-glass ("PSG", hereinafter) build-up process are performed in the second post-process portion 128. An aluminum deposition process is performed in the third post-process portion 138.

In the etching portion (116, 126, 136) of each circuit pattern forming apparatus (110, 120, 130), an outermost layer of the linear semiconductor material 30 which is formed in the previous apparatus is etched. In the post-processing portion 118 of the first circuit pattern forming apparatus 110, for example, a polysilicon layer is formed as the outermost layer on which a second layer is etched according to the second circuit pattern in the etching portion 126 of the next circuit pattern forming apparatus 120.

Similarly, in the post-processing portion 128 of the second circuit pattern forming apparatus 120, a PSG layer is formed as the outermost layer on which a third layer is etched according to the third circuit pattern in the etching portion 136 of the circuit pattern forming apparatus 130. An aluminum layer formed as an outermost layer on the linear semiconductor material 30 in the post-processing portion 138, is etched by an etching portion (not shown) according to a fourth circuit pattern in a fourth circuit pattern forming apparatus (not shown).

The linear semiconductor material 30 is coiled on the coiling drum 104, and is transferred to the semiconductor assembly apparatus 200 by the conveyer apparatus 300 (FIG. 2).

Figure 5:
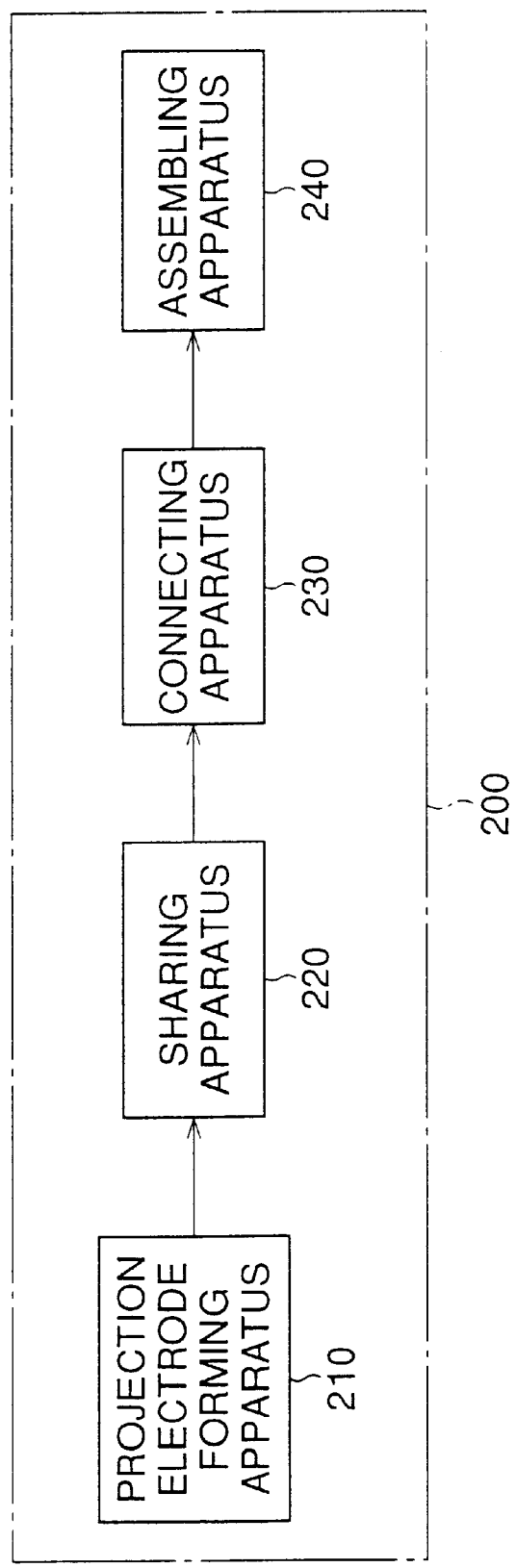
FIG. 5 is a block diagram showing the semiconductor assembly apparatus identified in FIG. 2.

FIG. 5 is a generic block diagram showing the semiconductor assembly apparatus identified in FIG. 2. The semiconductor assembly apparatus 200 includes a projection electrode forming apparatus 210, a shearing apparatus 220, a connecting apparatus 230 and an assembling apparatus 240.

In the projection electrode forming apparatus 210, the projection electrodes 52 are formed on the outer surface of the linear semiconductor 50. A metal material is disclosed in portions of the outer surface where the projection electrodes 52 are to be formed, while other portions remain coated with the oxide layer. A metal layer is built-up on the disclosed metal and a plating is applied, thus the projection electrodes 52 are formed. A metal-bump is transferred to the outer surface of the linear semiconductor 50 under a pressure and a heat.

In the shearing apparatus 220, the linear semiconductor 50 is separated into desired lengths, for example, 105 mm.

Figure 6:
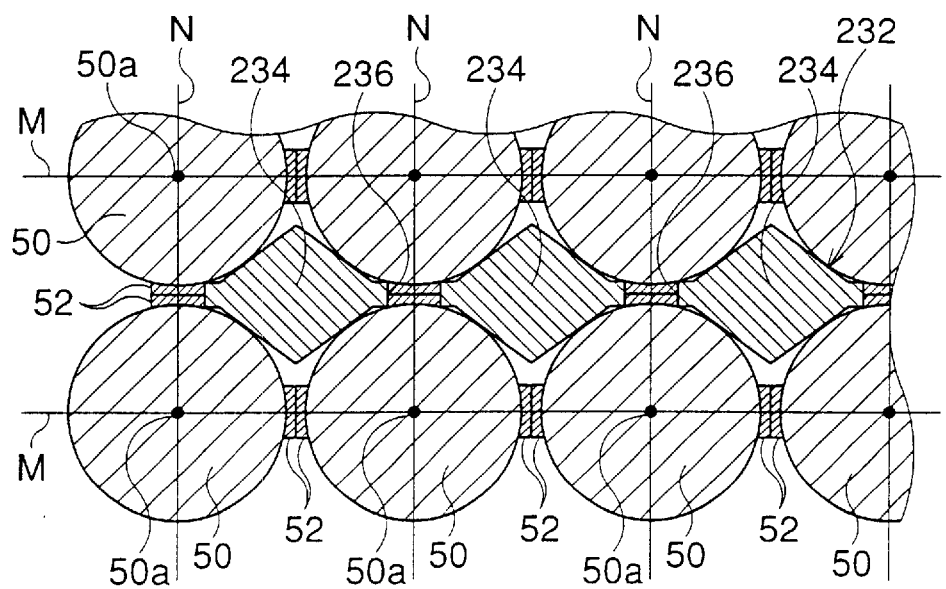
FIG. 6 is a partial section view showing a plurality of linear semiconductors connected by means of connection units and a spacer unit.

In the connecting apparatus 230, 62500 of the linear semiconductors 50 are aligned and bundled into a matrix cross-section configuration of 250×250. Neighboring pairs of the linear semiconductors 50 are contacted and electrically connected at their projection electrodes 52. In FIG. 6, longitudinal central axes 50$a$ of the linear semiconductors 50 are aligned along horizontal parallel lines M and along vertical parallel lines N. A distance between axes 50$a$ of the linear semiconductors 50 neighboring in a horizontal or vertical direction is equal to a diameter of the linear semiconductor 50 plus a thickness of a pair of the projection electrodes 52.

A high-temperature inactive gas of 300° C. is supplied into spaces between the linear semiconductors 50 such that the projection electrodes 52 become molten and fuse, allowing an electrical connection to occur between adjacent projection electrodes 52. The spacer unit 232 is liquefied at a temperature lower than the melting temperature of the projection electrodes 52. The spacer unit 232 is made of acrylic resin, polyethylene or other material which does not deteriorate the linear semiconductors 50 upon melting.

In the assembling apparatus 240 (FIG. 5), 62500 of the linear semiconductors 50 are incorporated in the casing 42, and predetermined linear semiconductors 50 are electrically connected to the outer terminals 44. Through the processes above, the semiconductor device 40 in FIG. 1 is obtained.

The projection electrode forming apparatus 210 may be positioned prior to the coiling drum 104 in the semiconductor circuit forming apparatus 100. The order of the processes in the projection electrode forming apparatus 210 and the shearing apparatus 230 may be reversed if necessary.

Figure 7:
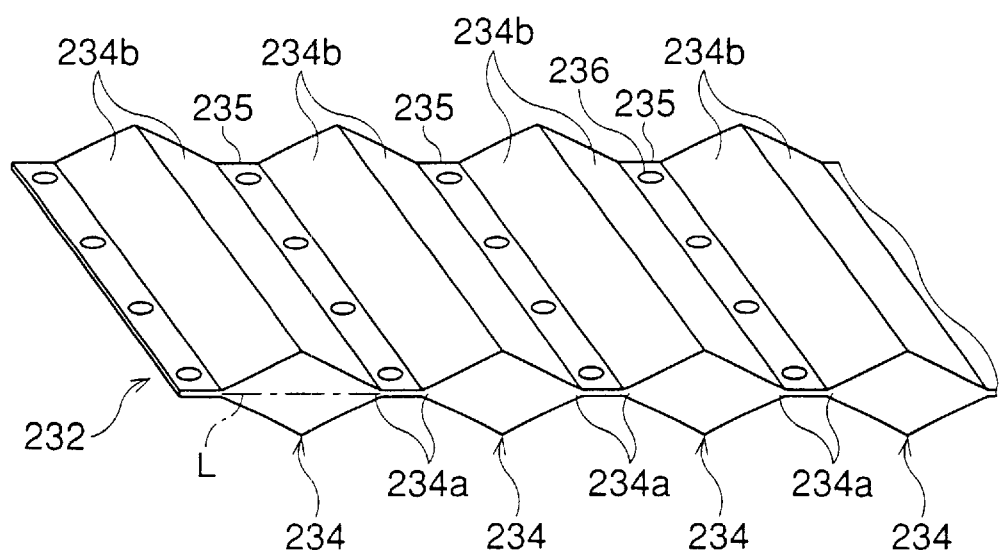
FIG. 7 is a perspective view of the spacer unit of FIG. 6.

FIG. 7 is a perspective view of the spacer unit 232 in FIG. 6. Upon liquefaction, the spacer unit 232 can be washed away by a solvent flowing through spaces between the linear semiconductors 50. When the spacer unit 232 is made of acrylic resin, the solvent for removing the liquefied spacer unit 232 is a chlorine-based solvent, such as chloroform, and when made of polyethylene, tetrahydrofuran, for example, is used.

The spacer unit 232 includes a plurality of longitudinal members 234 of a rhomboid cross-section aligned in parallel in a lateral direction, each of which decreases in thickness outwardly in the lateral direction. Each longitudinal member 234 is connected with a neighboring longitudinal member 234 at a narrow portion thereof. The longitudinal member 234 are uniformly and linearly aligned with a longer diagonal L of the rhomboids, being contiguous with each other.

The linear semiconductors 50 contact side surfaces 234b of the longitudinal members 234 and are supported by the side surfaces 234b. At narrow portions 234a of the longitudinal members 234, a plurality of holes 236 are formed along an interposed strip 235, interposed between the longitudinal members 234 and joining adjacent narrow portion 234a. The holes 236 correspond to the projection electrodes 52, such that linear semiconductors 50, supported by one spacer unit 232, are accurately positioned along lines M and N. By thus aligning the linear semiconductors 50 horizontally and vertically, interposed by the spacer unit 232, a matrix alignment is formed. Each of the longitudinal members 232 is surrounded by four linear semiconductors 50 contacting the four side surfaces 234b.

In order to align 250×250 linear semiconductors 50 in the first embodiment, 249 spacer units 232 are necessary, and 251 longitudinal members 234 are necessary in each spacer unit 232. A process of aligning 250 linear semiconductors 50 and laying the spacer unit 232 on the linear semiconductors 50 is repeated 250 times. Thus, 62500 linear semiconductors 50 are unified in a block matrix arrangement.

The 62500 linear semiconductors 50 are simultaneously welded in the first embodiment above, however, welding may be performed plane by plane for the 250 linear semiconductors 50.

As mentioned above, the semiconductor device 40 is constructed by the linear semiconductors 50 being aligned in a matrix arrangement. In the conventional semiconductor manufacturing apparatus, only one surface of a wafer is available for forming a circuit pattern, however, in the above embodiment, all of the circumferential surface of the linear semiconductor 50 is available for forming the circuit pattern, thus a far greater percentage area is utilized. The semiconductor device becomes smaller, when compared with a conventional semiconductor device of the same capability, and the process speed is improved due to a decrease in delay time in the smaller semiconductor device.

Conductor lines may be utilized, being a high speed conductors of gold, aluminum and so forth, thus a high working speed is obtained. Electrical noise reduction is possible for each of the linear semiconductors 50, thus a three-dimensional circuit of practically zero noise is possible. Extremely high density is realized in the semiconductor device 40, and, for example, a compact DRAM of high capacity is thus obtainable.

A large scale manufacturing apparatus is necessary for large size single silicon crystal column of about 200 mm in diameter for a conventional semiconductor device, while the semiconductor base filament manufacturing apparatus of the above embodiment handles semiconductors of not more than 5 mm in diameter, and is much smaller in size than a conventional apparatus. The process speed of the manufacturing becomes higher than that of a conventional apparatus. The manufacturing cost and manufacturing time are decreased due to a continuous process, not being an intermittent process as in the manufacture of a conventional device.

In a conventional liquid phase epitaxial process, wafers are aligned in a furnace and a silicon solvent is injected, while, in the embodiment above, the linear semiconductor base filament 31 is passed through a container of silicon solvent. Thus, the manufacturing process becomes simpler, and the manufacturing time becomes shorter.

Figure 8:
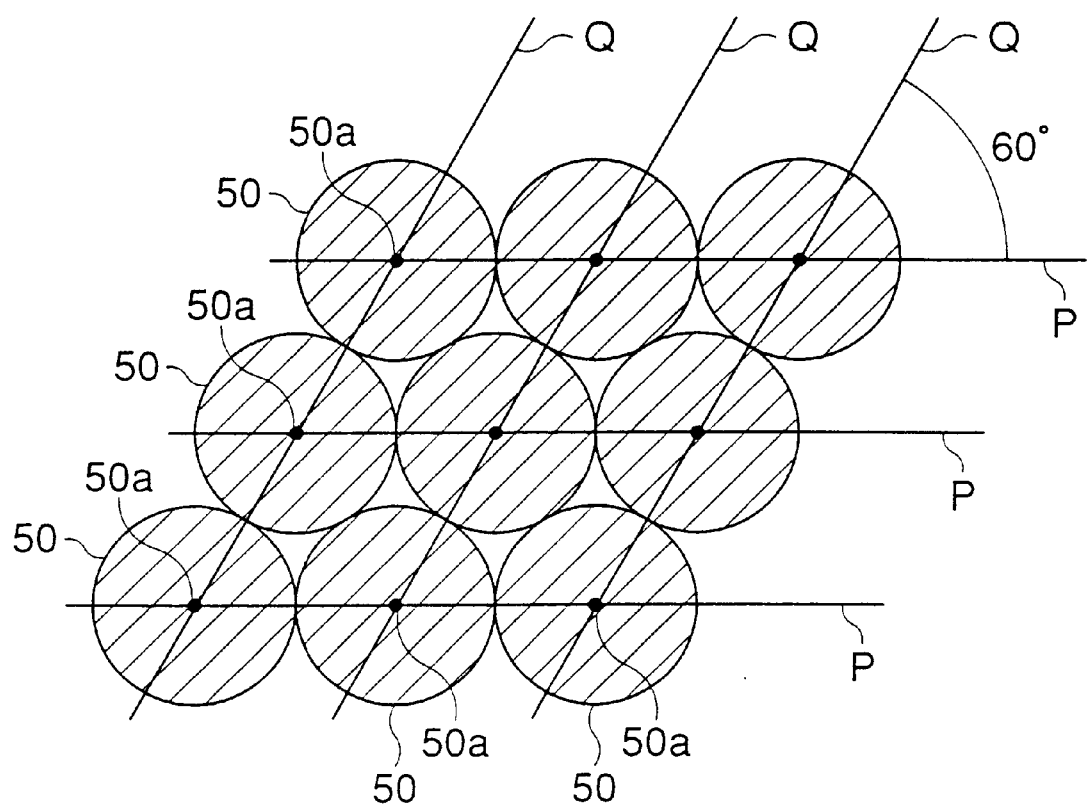
FIG. 8 is a sectional view showing an arrangement of linear semiconductors in a second embodiment of the semiconductor device.

FIG. 8 is a sectional view showing an arrangement of the linear semiconductors 50 in a second embodiment of the semiconductor device. The second embodiment is different only in an arrangement manner of the linear semiconductors 50.

In FIG. 8, the linear semiconductors 50 are aligned in a 60 degrees rhombic matrix, different from the first embodiment of the square matrix. The axes 50a of the linear semiconductors 50 are positioned on points of intersection of parallel lines P and Q crossing each other at angles of 60 degrees.

In this embodiment, each of the linear semiconductors 50 is spaced from neighboring linear semiconductors 50 by substantially equal distances, being the diameter of the linear semiconductor 50 plus the thickness of a pair of the projection electrodes 52. Since, in the first embodiment, distance between neighboring linear semiconductors 50 in a diagonal direction is $\sqrt{2} \times d$ (d: distance between horizontal or vertical neighbors), much straighter linear semiconductors (50) may be incorporated in a semiconductor device (40) of the second embodiment than those of the first embodiment.

Figure 9:
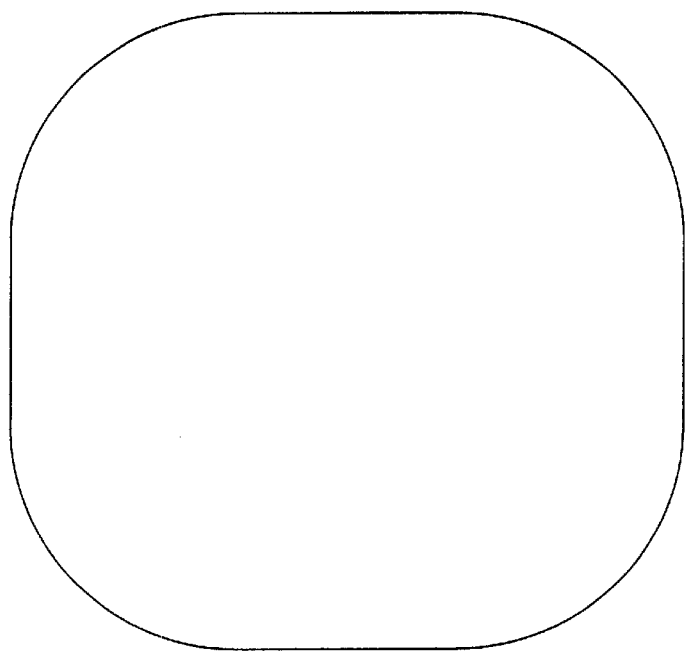
FIG. 9 is a sectional view showing a cross-section of the linear semiconductor material.
Figure 10:
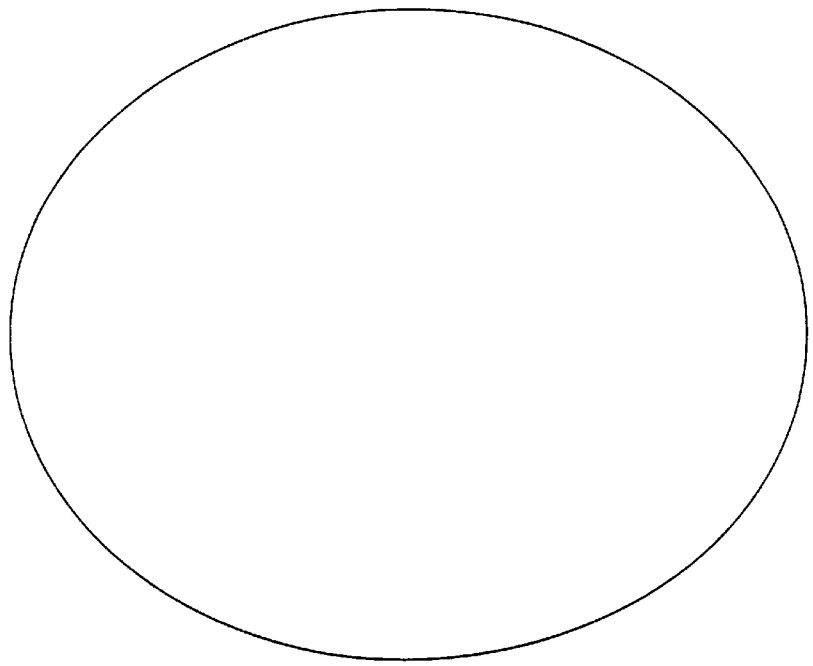
FIG. 10 is a sectional view showing another cross-section of the linear semiconductor material.

FIGS. 9 and 10 are sectional views showing a cross-section of the linear semiconductor material 30. FIG. 10 shows a deformation of oval cross-section due to directional ununiformity of temperature and gas density. Various deformations may occur depending on a composition of the material, material manufacturing condition, circuit forming condition, and so forth. The cross-section of the linear semiconductor 50 may be deformed to be a polygon or an oval due to an oblique crystallographic axis or to thermal deformation. The cross-section may be other polygons, such as a rectangle, a hexagon and so forth, or an oval, a chamfered polygon, a deformed polygon, or other various shapes. The linear semiconductor material 30 of the present invention may have a cross-section of any the above shapes.

The semiconductor device 40 according to the present invention may include a coolant fluid circulated through spaces between the linear semiconductors 50 to allow heat-sink cooling. The coolant fluid can be an inactive liquid reacting neither with the semiconductors 50 nor with the metal, or an inactive gas, such as argon, or nitrogen. A pressure unit for feeding coolant may be disposed in a vicinity of the semiconductor device 40 to feed the coolant fluid to the outer surface of linear semiconductors 50. The axes 50a of the linear semiconductors 50 may be inclined from the horizontal, such that the gas coolant flows due to convection.

Figure 11:
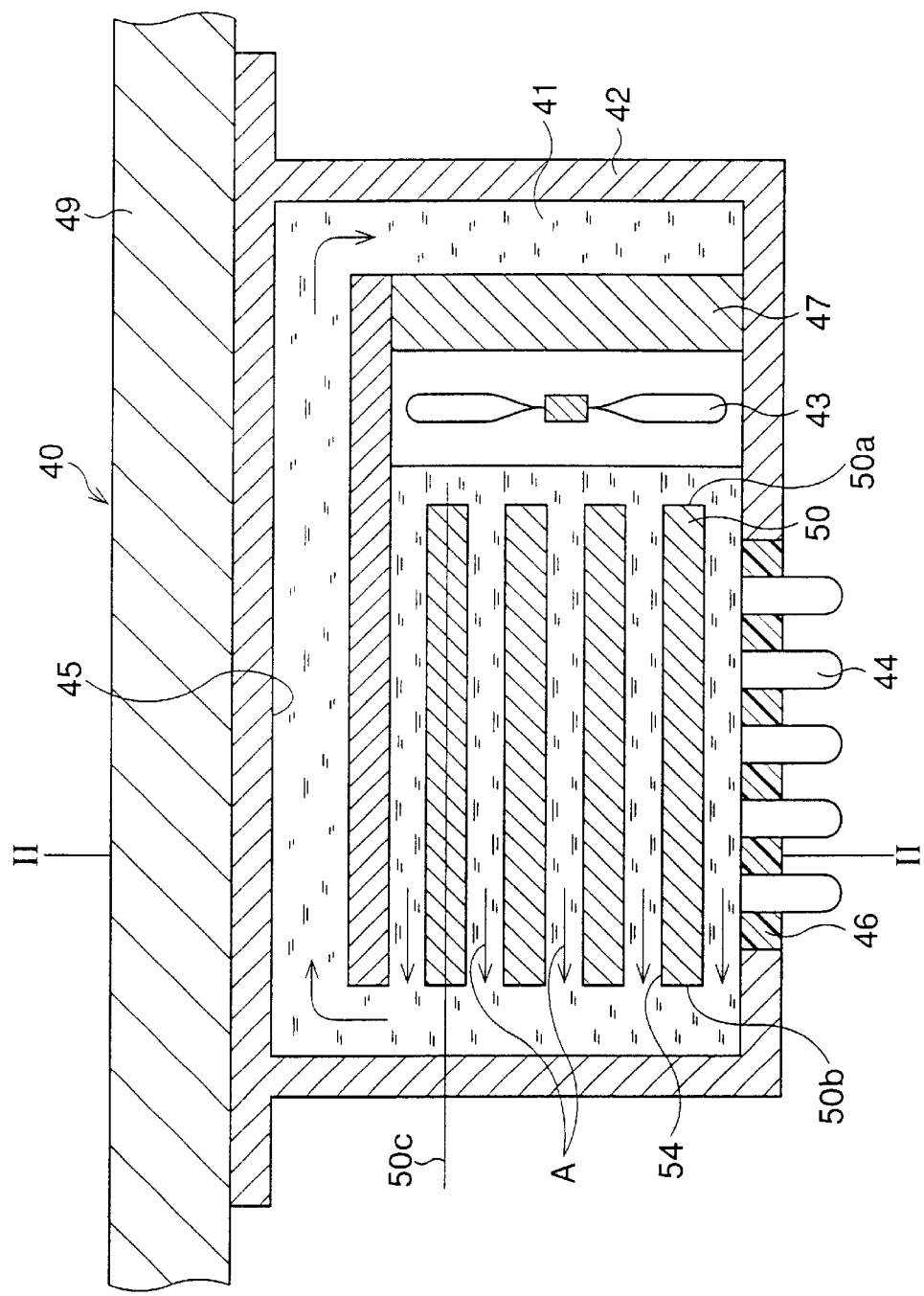
FIG. 11 is a sectional elevational view showing a third embodiment of the semiconductor device.
Figure 12:
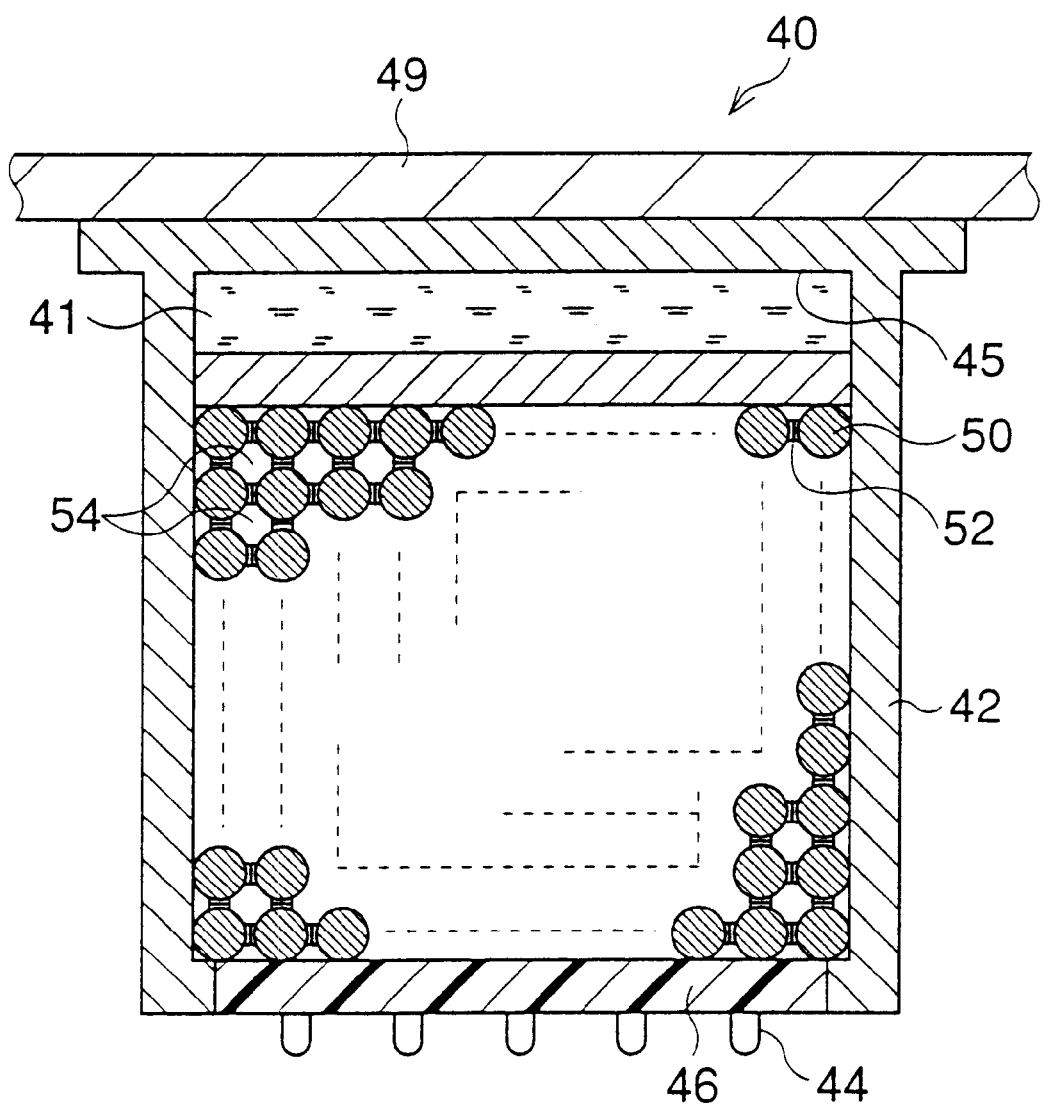
FIG. 12 is a sectional view along a line II—II in FIG. 11.

FIG. 11 is a sectioned elevational view showing a third embodiment of the semiconductor device 40, and FIG. 12 is a sectional view along a line II—II in FIG. 11. The semiconductor device 40 includes a rectangular sealed casing 42 in which a plurality of the linear semiconductors 50, of a predetermined length, are aligned in parallel to exhibit a square matrix cross-section perpendicular to a longitudinal direction of the linear semiconductor device 40. The linear semiconductors 50 are interconnected at projection electrodes 52. A plurality of outer terminals 44 project from a bottom surface of the casing 42, and are electrically connected with predetermined linear semiconductors 50. Neighboring outer terminals 44 are insulated from each other by an insulated layer 46.

The casing 42 is filled with a coolant fluid 41 that is circulated by fan 43, positioned adjacent to an end portion 50c of the linear semiconductors 50. The coolant fluid 41 is pure water, nitrogen gas or other fluid that does not deteriorate the linear semiconductors 50. The fan 43 is connected to and driven by a driver circuit (not shown) formed on the linear semiconductors 50. An axial flow pump may be utilized instead of the fan 43. A temperature of the coolant fluid 41 is sensed by a circuit formed on the linear semiconductors 50 such that a quantity of the flowing coolant is controlled.

The coolant fluid 41 flows through a space 54 between neighboring linear semiconductors 50 in a direction A parallel to the central axes 50a of the linear semiconductors 50. The linear semiconductors 50 are cooled by the flowing coolant fluid 41. The space 54 is exaggeratedly enlarged for ease of understanding, and the linear semiconductors 50 are partially shown in FIG. 12.

A passageway 45 is formed over the bundle of linear semiconductors 50 through which the coolant fluid 41 flows in the reverse direction to the flowing direction A in the space 54, from an end portion 50b of the linear semiconductor 50 opposite the end portion 50c. Then, the coolant fluid 41 is filtered by a filter 47 downstream of and adjacent to the fan 43, before being fed by the fan 43 to the linear semiconductors 50 again. Thus, the coolant fluid 41 is circulated. Since the casing 42 is sealed and the filter 47 is disposed in the passage of the coolant fluid, the coolant fluid 41 is kept clean.

The casing 42 is made of a material of high heat conductivity, such as a metal or crystallized carbon fiber board. A heat-sink 49 is fixedly adhered to an outer surface of the casing 42, parallel to the passageway 45, such that heat energy carried by the coolant fluid 41 after the cooling of the linear semiconductors 50 is dissipated by the casing 42 or by the heat-sink 49.

In the semiconductor device 40 of the third embodiment, an effect is achieved that the semiconductor device 40 is prevented from an adverse temperature rise, in addition to the effect of having a compact size.

Similarly to the first embodiment, the manufacturing cost and the manufacturing time are decreased, because the manufacturing apparatus becomes smaller and the manufacturing process is continuous.

Finally, it will be understood by those skilled in the art that the foregoing description is of preferred embodiments of the device, and that various changes and modifications may be made to the present invention without departing from the spirit and scope thereof.

The present disclosure relates to subject matters contained in Japanese Patent Application No. 10-194570 (filed on Jul. 9, 1998) which is expressly incorporated herein, by reference, in its entirety.

What is claimed is:

1. A semiconductor device:
   a plurality of linear semiconductors of a predetermined length that are aligned laterally and in parallel, and bundled into a matrix cross-section configuration, at least one electronic element being formed on a cylindrical outer surface of said linear semiconductors.

2. The semiconductor device of claim 1, wherein ends of said linear semiconductors are aligned in a square matrix arrangement.

3. The semiconductor device of claim 1, wherein ends of said linear semiconductors are aligned in a 60 degrees rhombic arrangement.

4. The semiconductor device of claim 1, wherein said linear semiconductors are electrically interconnected.

5. The semiconductor device of claim 1, wherein each of said linear semiconductors comprises at least one projection electrode fixed to and electrically connected with a corresponding projection electrode of an adjacent linear semiconductor.

6. A semiconductor assembly apparatus that assembles said semiconductor device of claim 1, comprising:
   an arrangement member that aligns said plurality of linear semiconductors laterally and in parallel; and
   a connecting member that interconnects said linear semiconductors aligned by said arranging member.

7. The semiconductor assembly apparatus of claim 6, wherein said arrangement member arranges ends of said linear semiconductors in a square matrix arrangement.

8. The semiconductor assembly apparatus of claim 6, wherein said arrangement member arranges ends of said linear semiconductors in a 60 degrees rhombic arrangement.

9. The semiconductor assembly apparatus of claim 6, wherein said arrangement member includes an alignment member that securely positions said linear semiconductors.

10. The semiconductor assembly apparatus of claim 9, wherein said connecting member electrically interconnects said linear semiconductors when heated, and said arrangement member is liquefied when heated.

11. A semiconductor assembly apparatus that assembles a semiconductor device, the semiconductor device comprising a plurality of linear semiconductors of a predetermined length that are aligned laterally and in parallel, and bundled into a matrix cross-section configuration, at least one electronic element being formed on an outer surface of the linear semiconductors, the semiconductor assembly apparatus comprising:
   an arrangement member that aligns said plurality of linear semiconductors laterally and in parallel;
   a connecting member that interconnects said linear semiconductors aligned by said arrangement member;
   wherein said arrangement member includes an alignment member that securely positions said linear semiconductors;
   wherein said arrangement member includes longitudinal rhomboid cross-section members and connecting members connecting adjacent longitudinal members.

12. The semiconductor assembly apparatus of claim 11, wherein side surfaces of said longitudinal members contact said outer surface of said linear semiconductors.

13. The semiconductor assembly apparatus of claim 11, wherein said connecting member is provided with holes that receive and engage projection electrodes formed on said outer surface of said linear semiconductors.

14. The semiconductor device of claim 1, further comprising a coolant fluid that flows adjacent to said linear semiconductors so as to cooling said hear semiconductors.

* * * * *